United States Patent [19]

Yu et al.

[11] Patent Number: 4,476,476
[45] Date of Patent: Oct. 9, 1984

[54] CMOS INPUT AND OUTPUT PROTECTION CIRCUIT

[75] Inventors: James C. Yu, San Jose; Suman H. Patel, Sunnyvale, both of Calif.

[73] Assignee: National Semiconductor Corporation, Santa Clara, Calif.

[21] Appl. No.: 249,934

[22] Filed: Apr. 1, 1981

Related U.S. Application Data

[63] Continuation of Ser. No. 027,442, Apr. 5, 1979, abandoned.

[51] Int. Cl.³ .................................... H01L 27/04
[52] U.S. Cl. .................... 357/23.13; 357/13; 357/42; 357/43; 357/44
[58] Field of Search ............ 357/43, 42, 41, 13, 357/23 GP, 44; 361/88, 90

[56] References Cited

U.S. PATENT DOCUMENTS

| | | | |
|---|---|---|---|
| 3,934,159 | 1/1976 | Nomiya et al. | 357/41 |
| 3,967,295 | 6/1976 | Stewart | 357/41 |
| 4,143,391 | 3/1979 | Suzuki | 357/43 |

FOREIGN PATENT DOCUMENTS 52-38890  3/1977  Japan .................................... 357/42

Primary Examiner—William D. Larkins
Attorney, Agent, or Firm—Gail W. Woodward; Paul J. Winters; Michael J. Pollock

[57] ABSTRACT

A CMOS gate protection diode clamping the input terminal to substrate potential is prevented from injecting carriers into the substrate and causing SCR latchup by forming the diode as a well to substrate junction, surrounded by another, reverse-biased, well, to both reduce injection and collect parasitic injected carriers before they can diffuse to cause latchup.

6 Claims, 4 Drawing Figures

CMOS INPUT AND OUTPUT PROTECTION CIRCUIT

This application is a continuation, of application Ser. No. 027,442, filed Apr. 5, 1979 now abandoned.

BACKGROUND OF THE INVENTION

1. Field of the Invention

The invention relates to protective circuits for CMOS integrated circuits which prevent damage to the gate oxide of the CMOS transistors and which raise the magnitude of the input signal that will trigger the inherent SCR structure contained within CMOS integrated circuits to prevent SCR latchup.

2. Description of the Prior Art

One type of prior art protective circuit which has been used to protect the gate oxide of the field effective transistors within CMOS integrated circuits consists of first and second protective diodes which are poled with respect to an input terminal, a first power supply terminal and a second power supply terminal (ground or negative potential) so that the anode of the first diode is coupled to the input terminal and the cathode of the first diode is coupled to a first power supply terminal, the cathode of the second diode is coupled to the input terminal and the anode of the second diode is coupled to a second power supply terminal. This circuit has also been used in configurations where the second power supply terminal is negative with respect to ground.

This circuit effectively prevents damage caused by potentials such as noise which are applied to the gate oxide of the CMOS circuit elements during operation that are greater than the first power supply terminal potential or less than the second power supply terminal potential. However, this circuit has the disadvantage that the inherent npnp and pnpn SCR structure of CMOS circuits will be triggered at input potentials as low as 0.6 volts greater than the first power supply terminal potential or 0.6 volts less than the second power supply terminal potential. Triggering of the inherent CMOS circuit SCR causes latchup which normally can only be stopped by turning off the circuit.

The first protective diode, which has its anode coupled to the circuit input, forms a pnpn SCR with n channel MOSFETS which are diffused into a p type well that contains the n type source and drain electrodes for the n channel MOSFETS.

The second protective diode, which has its cathode coupled to the circuit input, forms a npnp SCR with p channel MOSFETS which have p type source and drain diffusions within the n channel substrate.

Application Ser. No. 12042, now U.S. Pat. No. 4,264,941 entitled "Protective Circuit for Insulated Gate Field Effect Transistor Integrated Circuits", which is also assigned to the assignee of this application, discloses a protective circuit, which is useful for preventing damage to the gate oxide of CMOS integrated circuits during "zap testing", having first and second bipolar transistors of opposite conductivity type which have their emitter to collector circuit connected respectively in parallel with first and second protective diodes. The circuit input is coupled to the anode of the first protective diode and the cathode of the second protective diode. The cathode of the first protective diode is coupled to the drain power supply and the anode of the second protective diode is connected to the source power supply.

The protective circuit disclosed in Ser. No. 12042 differs from the instant invention in that the protective transistors disclosed in Ser. No. 12042 are biased into conduction during reverse bias testing of the protective diodes. In the present invention, the protective transistors are biased into conduction during forward biasing of the protective diodes during circuit operation.

SUMMARY OF THE INVENTION

The invention includes first and second protective diodes which are poled with respect to an input terminal; first power supply potential terminals and second power supply potential terminals (ground or negative potential) of a CMOS integrated circuit so that the anode of the first diode and the cathode of the second diode are coupled to the input terminal; the cathode of the first diode is coupled to a first power supply potential terminal; and the anode of the second diode is coupled to a second power supply potential terminal. First and second bipolar transistors, of opposite conductivity, are provided with their emitters coupled to the circuit input terminal; the base of the first transistor coupled to a first power supply potential terminal; the collector of the first transistor coupled to a second power supply potential terminal; and the base of the second transistor coupled to a second power supply terminal and the collector of the second transistor coupled to a first power supply terminal.

Both the first transistor and the first diode conduct when potentials are applied to the circuit input which are greater than the first power supply terminal potential. The conduction of the first transistor collects excess current from the circuit input terminal which otherwise would conduct through the first diode and the integrated circuit substrate and which could cause gate oxide rupture or trigger undesirable SCR action within the inherent SCR pnpn structure of the CMOS integrated circuit.

The second transistor and the second diode conduct when potentials are applied to the input which are less than the second power supply terminal potential. The conduction of the second transistor collects excess current from the circuit input terminal which otherwise would conduct through the first diode and the integrated circuit substrate and which could cause gate oxide rupture or trigger undesirable SCR action within the inherent SCR npnp structure of the CMOS integrated circuit.

The bipolar transistors are integrated within a semiconductor substrate with a centrally disposed emitter, an annular base surrounding the emitter and annular collector surrounding the emitter and the base. The annular collector of each transistor is an efficient collector of substrate current which is caused by the application of input potentials greater than the first power supply terminal potential or less than the second power supply potential. Efficient collection of substrate current decreases the chance of SCR latchup.

The protective circuit of the present invention may be used in configurations where the reference potential is not ground such as CMOS transistor circuits using a positive first power supply terminal potential $V_{DD}$ and a negative second power supply terminal potential $V_{SS}$.

The protective circuit of the present has the advantage that it may be integrated by using the same process steps which are used for fabrication of the CMOS circuit.

DESCRIPTION OF THE PREFERRED EMBODIMENT

Figure 1:
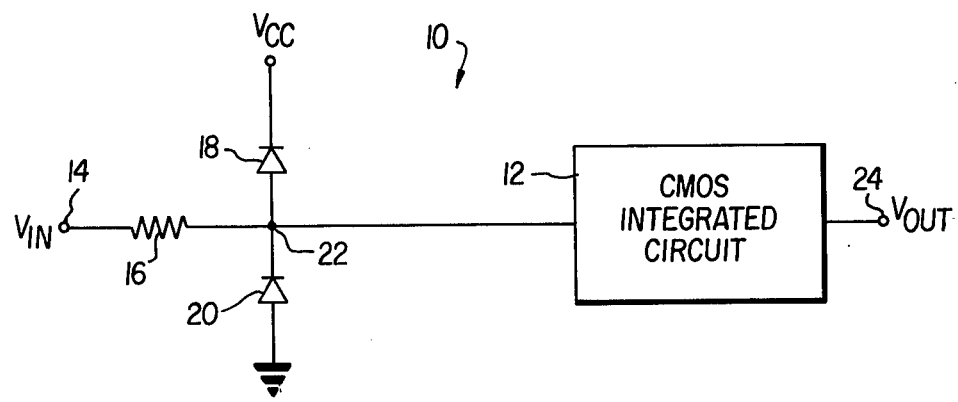
FIG. 1 is a schematic of the prior art circuit of which the present invention is an improvement.

FIG. 1 is a schematic of a prior art protection circuit 10 which effectively prevents input potentials greater than a first positive power supply terminal potential $V_{CC}$ or less than a second power supply terminal potential ground from damaging the gate oxide of a CMOS integrated circuit 12 which may be any CMOS circuit configuration. The circuit input 14 is coupled to an input impedance 16 which is representative of the impedance of polysilicon which couples the input of the integrated circuit to the anode of a first protective diode 18 and the cathode of a second protective diode 20. The cathode of diode 18 is coupled to the first power supply terminal potential $V_{CC}$. The anode of diode 20 is coupled to the second power supply terminal potential ground. This circuit has also been implemented with the cathode of diode 18 coupled to a positive power supply potential conventionally identified as $V_{DD}$ and the anode of diode 20 coupled to negative power supply potential conventionally identified as $V_{SS}$. The junction 22 between the first and second diodes is the input to the CMOS circuit 12. The output 24 of the circuit 12 may be coupled to other circuits.

The circuit of FIG. 1 has the disadvantage that positive potentials of approximately 0.6 volts greater than the first power supply terminal potential cause the latchup of the inherent pnpn structure associated with diode 18 and the n channel field effect transistors of CMOS integrated circuit 12 and that negative potentials of approximately 0.6 volts less than the second power supply terminal potential cause the latchup of the inherent npnp structure associated with diode 20 and the p channel field effect transistors of integrated circuit 12. Once SCR conduction starts, the circuit must be turned off before proper circuit operation can occur.

Figure 2:
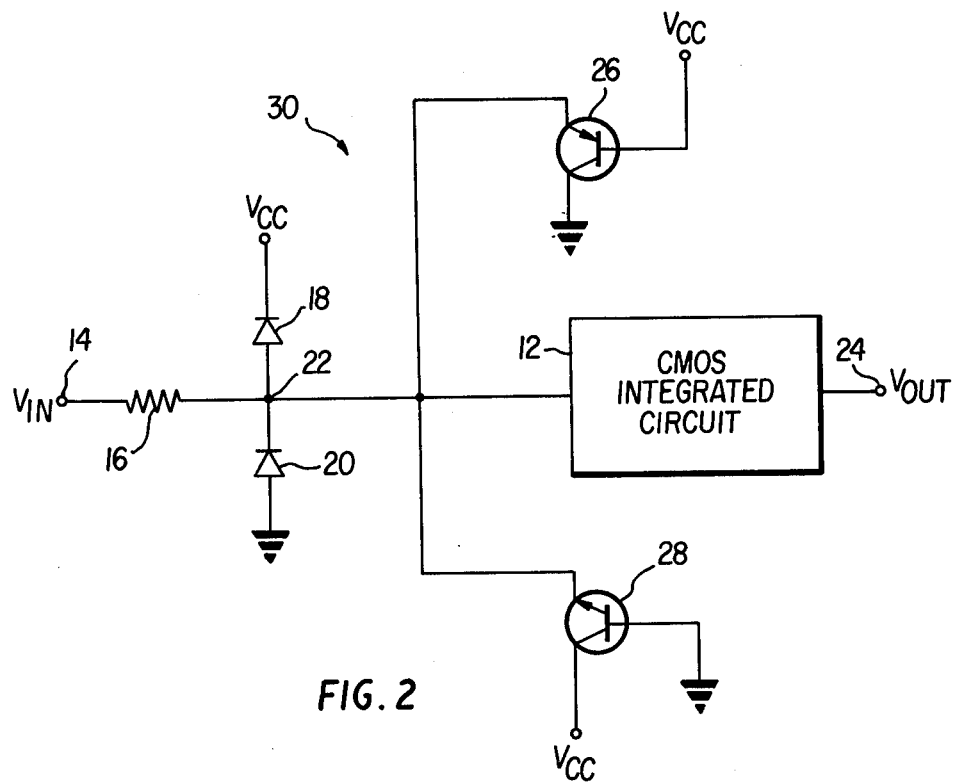
FIG. 2 is a schematic of a protective circuit in accordance with the present invention.

FIG. 2 is a schematic of a protection circuit 30 in accordance with the present invention. The same numbers in FIGS. 1 and 2 identify like parts. The junction 22 is coupled to the emitters of first and second bipolar transistors 26 and 28 which are of opposite conductivity type. The base of the first transistor 26 is coupled to the first power supply terminal potential $V_{CC}$ and the collector is coupled to the second power supply terminal potential ground. The base of the second transistor 28 is coupled to the second supply terminal potential ground and the collector is coupled to the first power supply terminal potential $V_{CC}$. The junction 22 is also coupled to the input of integrated circuit 12 which may be any CMOS circuit.

Figure 3:
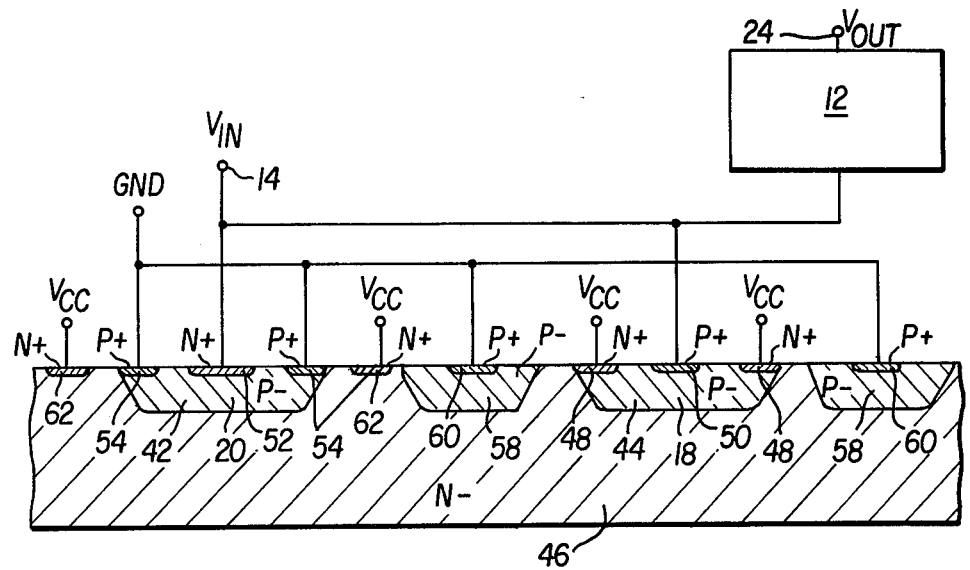
FIG. 3 is a cross section taken along line A—A of FIG. 4.
Figure 4:
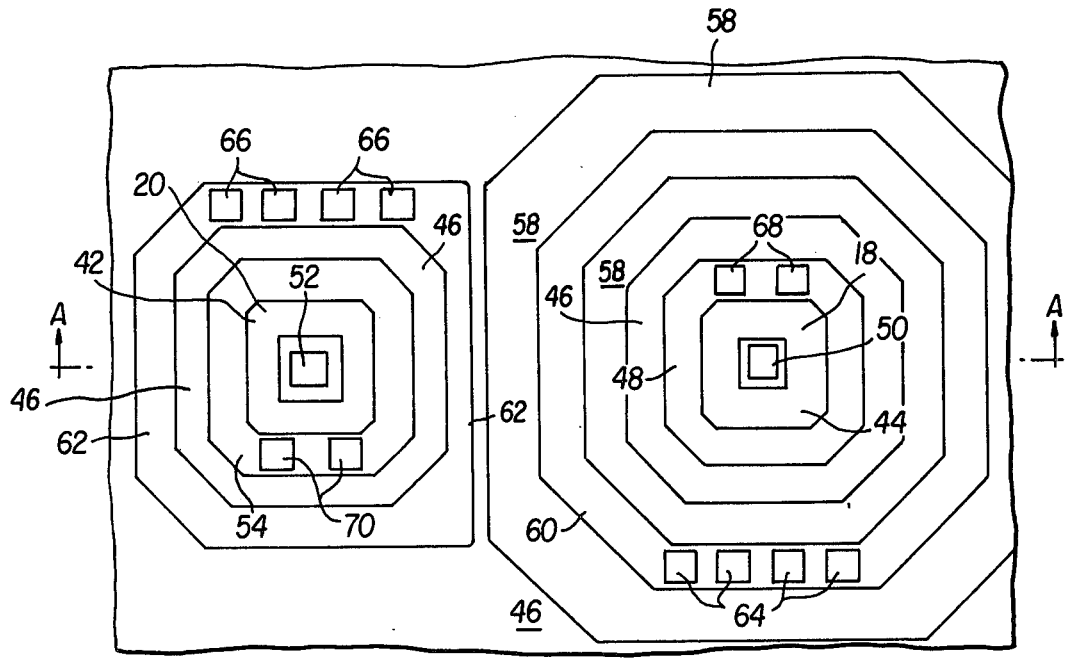
FIG. 4 is a top view of an integrated circuit which implements the present invention.

FIGS. 3 and 4 illustrate a protection circuit 30 in accordance with the invention in an integrated circuit. FIG. 4 is a cross section of FIG. 4 taken along sectional line A—A. The same numbers in FIGS. 2, 3 and 4 identify like parts. For clarity, FIGS. 3 and 4 omit a detailed illustration of the CMOS field effect transistor circuit 12 since the present invention is applicable to all types of CMOS silicon gate integrated circuits.

The protective diodes 18 and 20 are respectively implemented in p- wells 44 and 44 which are contained in an n-substrate 46 of the integrated circuit. The diode 18 consists of two junctions. The first junction is a p—n+ junction disposed between the interface of n+ contact ring 48 and the p— well 44. The n+ contact ring 48 is connected to $V_{CC}$. The second junction is a p—n— junction disposed between the p— well 44 and the n— substrate 46. A p+ contact diffusion 50 couples the circuit input 14 to the diode 18. The diode 20 consists of a single p—n+ junction disposed between the interface of n+ diffusion 52 and p— well 42. The n+ diffusion 52 is coupled to the circuit input 14. A p+ contact ring 54, which is coupled to ground, is disposed on top of the p— well 42.

The pnp transistor 26 is integrated in the n— substrate 46 as two lateral transistors. The first transistor, which is dominant, consists of a p— emitter contained within p— well 44 which is coupled to the input 14 by the p+ contact diffusion 50, an n— base which is contained in the n— substrate 46 that is coupled to $V_{CC}$ by contact ring 62 and a collector consisting of p— ring 58 and a p+ contact diffusion 60 which is coupled to ground. The beta of the first lateral transistor is greater than the beta of the second lateral transistor. In the first lateral transistor, the emitter to base junction is disposed between the p— well 44 and the substrate 46. The second transistor, which has a lower beta because of its base to emitter geometry consists of a p— emitter contained with p— well 44 that is coupled to input 14 by the p+ contact diffusion 50, a base consisting of n+ diffusion 48 and n— substrate 46 and a collector consisting of p— ring 58 and p+ contact diffusion 60 which is coupled to ground. In the second lateral transistor, the emitter to base junction is disposed between p— well 44 and n+ ring 48.

The npn transistor 28 is integrated in the n— substrate 46 as two lateral transistors. The first transistor, which is dominant, consists of an n+ emitter 52 which is coupled to the input 14, a p— base contained within the p— well 42 which is coupled to ground by p+ ring 54 and a collector consisting of the n— substrate 46 and n+ ring 62 which is coupled to $V_{CC}$. The beta of the first lateral transistor is greater than the beta of the second lateral transistor. In the first lateral transistor, the base to collector junction is disposed between the p— well 42 and the n— substrate 46. The second transistor, which has a lower beta because of its base to emitter geometry consists of an n+ emitter 52 which is coupled to the input 14, a base consisting of p— well 42 and p+ diffusion 54 which is coupled to ground, and a collector consisting of n— substrate 46 and n+ ring 62 which is coupled to $V_{CC}$. In the second lateral transistor, the base to collector junction is disposed between p+ ring 54 and n— substrate 46.

The p— ring 58 and p+ contact 60 which function as the collector of the first and second transistors of transistor 26 and the n— substrate 46 and the n+ ring 62 which function as the collector of the first and second transistors of transistor 28 help to prevent latchup of the inherent SCR structures present in CMOS integrated circuits by efficiently collecting input circuit current flowing in the substrate 46 which is not conducted by the protective diodes 18 and 20 when potentials greater than the first power supply terminal potential $V_{CC}$ or less than the second power supply terminal potential ground are applied to the input 14. The conduction of transistors 26 and 28 protects the gate oxide of the CMOS circuit 12 by limiting the magnitude of the current flowing through the protective diodes 18 and 20.

It is necessary to limit the amount of current which can be drawn by the protective diodes 18 or 20 to prevent gate oxide rupture of the insulated gate field effect transistors present in a CMOS integrated circuit. A polysilicon input resistance 16 of approximately at least 250–350 ohms (10 square) will limit the current drawn by the protective diodes 18 and 20 to a magnitude which will prevent gate oxide rupture.

The four squares 64 which appear in FIG. 4 represent contacts between polysilicon conductors (not shown) and the underlying collector of transistor 26. Similarly, the four squares 66 represent contacts between polysilicon conductors and the underlying collector of transistor 28.

The two squares 68 which appear in FIG. 4 represent contacts between polysilicon conductors (not shown) and the underlying base of transistor 26. Similarly, the two squares 70 represent contacts between polysilicon conductors and the underlying base of transistor 28.

The number of circuit contacts is inversely proportional to the contact impedance. The use of four collector contacts enhances the collection of current from the substrate by providing a low impedance path between the substrate and the first and second power supply terminal potentials.

The integrated circuit of FIGS. 3 and 4 is covered with an insulative layer which has been omitted from FIGS. 3 and 4.

The application of a potential to the input 14 which is positive with respect to the first power supply terminal potential $V_{CC}$ causes diode 18, which consists of the interface between p− well 44 and n+ diffusion 48 and the interface between p− well 44 and the n− substrate 46, to be forward biased into conduction. The forward biasing of the diode 18 causes current to flow from the input 14, through the p+ diffusion 50, p− well 44, across the p−n+ junction of diode 18 to a first power supply terminal 48 at potential $V_{CC}$ and across the p−n− junction of diode 18, through the substrate 46 to a first power potential terminal 62 at potential $V_{CC}$.

The application of a positive potential to the input 14, which is greater than the first power supply terminal potential $V_{CC}$, also causes transistor 26 to be biased into conduction. The biasing of the transistor 26 into conduction causes current to flow from the input 14, through p+ diffusion 50, the p− emitter contained in well 44, across a p−n+ base to emitter junction, through a base consisting of n+ diffusion 48 and n− substrate 46 to the collector consisting of p− ring 58 and p+ diffusion 60 to ground, and from input 14, through p+ diffusion 50, the p− emitter contained in p− well 44, across a p−n− base to emitter junction, through a base consisting of n+ diffusion 48 and n− substrate 46 to the collector consisting of p− ring 58 and p+ diffusion 60 to ground. The positive potential applied to the input 14 forward biases the base to emitter junction by the base being at the first power supply terminal potential $V_{CC}$ while the emitter is at the positive input potential greater then $V_{CC}$. The base to collector junction is reverse biased by the base being at the positive first power supply potential $V_{CC}$ while the collector is at the second power supply terminal potential ground.

The application of a potential to the input 14 which is negative with respect to the second power supply terminal potential ground causes the diode 20, which consists of the interface between n+ diffusion 52 and p− well 42, to be forward biased into conduction. The forward biasing of the diode 20 causes current to flow from the second power supply terminal potential ground through p+ diffusion 54, p− well 42, across the p−n+ junction of diode 20 to the circuit input 14.

The application of a potential to the input 14 which is negative with respect to the second power supply terminal potential also causes transistor 28 to be biased into conduction. The conduction of transistor 28 causes current to flow from the first power supply terminal potential $V_{CC}$, through the collector consisting of n+ diffusion 62 and the n− substrate 46, across an n−p− collector to base junction, through a base consisting of p− well 42 and p+ contact diffusion 54, emitter 52 to input 14 and the first power supply terminal potential $V_{CC}$, and through the collector consisting of n+ diffusion 62 and the n− substrate 46, across a n−p+ collector to base junction, through a base consisting of p+ diffusion 54 and p− well 42 and emitter 52 to the input 14. The negative potential applied to input 14 forward biases the base to emitter junction by the base being at the second power supply terminal potential ground while the emitter is at an input potential which is negative with respect to ground. The base to collector junction is reverse biased by the base being at the second power supply terminal potential ground while the collector is at the positive first power supply terminal potential $V_{CC}$.

The present invention raises the potential at which SCR latchup occurs from input potentials from approximately 0.6 volts above $V_{CC}$ or below ground to approximately 4 volts above $V_{CC}$ or below ground by removing current flow within the substrate between the protective diodes 18 and 20 and the CMOS circuits. The annular structure of the collectors of transistors 26 and 28 enhances efficient collection of substrate current.

The invention may also be used with complementary symmetry insulated gate field effect transistor circuits which reference the cathode of diode 18 to a positive first power supply terminal potential $V_{DD}$ and the anode of diode 20 to a negative potential second power supply terminal $V_{SS}$.

EXAMPLE

The present invention provides an increase in the potential at which latchup occurs at 125° C. in response to an AC noise source having pulses of 1μ second duration at a frequency of 1 kHz. A CMOS RAM which was manufactured by the assignee of the present invention, and which had a protective circuit in accordance with FIG. 1 experienced a SCR latchup at 125° C. when the magnitude of the noise pulses applied to the input and output pins of the CMOS RAM reached 0.4 volts. A CMOS RAM which was manufactured by the assignee of the present invention, which had an input protective circuit consisting of a single bipolar transistor in parallel with a diode protective circuit in accordance with FIG. 1 and which bipolar transistor did not have the ring collector structure of either bipolar transistors of FIGS. 3 and 4 experienced SCR latchup at 125° C. when the magnitude of the noise pulses applied to the input and outputs of the CMOS RAM reached 1.0 volts. A CMOS RAM having an input protection circuit in accordance with the present invention did not experience SCR latchup until the magnitude of the noise pulses applied to the input and output pins of the CMOS RAM reached 2.0 volts at 125° C.

What is claimed is:

1. A protective circuit for a CMOS integrated circuit having an input terminal, a first power supply terminal which is adapted to be connected to a source of first power supply potential, and a second power supply terminal which is adapted to be connected to a source of second power supply potential, said protective circuit comprising:

(a) a body of semiconductor material of a first conductivity type forming a substrate;
   (b) a first diode having an anode coupled to the circuit input terminal and a cathode coupled to the first power supply terminal, said first diode comprising:
      (1) a first region extending into said substrate, said first region being of a second conductivity type opposite to said first conductivity type; and
      (2) a second region extending into said first region, said second region being of the first conductivity type, but having a higher degree of conductivity than said substrate;
   (c) a second diode having a cathode coupled to the circuit input terminal and an anode coupled to the second power supply terminal, said second diode comprising:
      (1) a third region extending into said substrate, said third region being of the second conductivity type; and
      (2) a fourth region extending into said third region, said fourth region being of the first conductivity type, but having a higher degree of conductivity than said substrate;
   (d) a first transistor coupled to the first diode and to the first power supply terminal, said first transistor being biased into conduction upon the application of a potential to the circuit input terminal which is sufficient to forward bias the first diode, the biasing of the first transistor into conduction and the forward biasing of the first diode causing current to flow from the circuit input terminal, said first transistor comprising:
      (1) an emitter region which includes said first region;
      (2) a base region which includes said substrate; and
      (3) a collector region which includes a fifth region of the second conductivity type extending into the substrate, said fifth region having a ring-like configuration which surrounds said first region; and
   (e) a second transistor coupled to the second diode and to the second power supply terminal, said second transistor being biased into conduction upon the application of a potential to the circuit input terminal which is sufficient to forward bias the second diode, the biasing of the second transistor into conduction and the foward biasing of the second diode causing current to flow from the seond power supply terminal, through the second diode and through the second transistor to the circuit input terminal, said second transistor comprising:
      (1) an emitter region which includes said fourth region;
      (2) a base region which includes said third region; and
      (3) a collector region which includes said substrate and a sixth region of the first conductivity type extending into said substrate to provide an ohmic contact thereto, said sixth region having a higher degree of conductivity than said substrate and having a ring-like configuration which surrounds said third region.

2. A protective circuit in accordance with claim 1, wherein said second region has a ring-like configuration within said first region.

3. A protective circuit in accordance with claim 2, further comprising:
   (a) a seventh region of second conductivity type extending into said third region to provide an ohmic contact thereto, said seventh region having a higher degree of conductivity than said third region and having a ring-like configuration within said third region;
   (b) an eighth region of the second conductivity type extending into said fifth region to provide an ohmic contact thereto, said eighth region having a higher conductivity than said fifth region and having a ring-like configuration within the boundaries of said ring-like fifth region; and
   (c) a ninth region of the second conductivity type extending into said first region to provide an ohmic contact thereto, said ninth region having a higher degree of conductivity than said first region.

4. A protective circuit in accordance with claim 1, wherein said first conductivity type is N type and said second conductivity type is P type, whereby said first diode is a PN diode with respect to the circuit input terminal, said second diode is an NP diode with respect to the circuit input terminal, said first transistor is of the PNP type, and said second transistor is of the NPN type.

5. A protective circuit in accordance with claim 4, further comprising a polysilicon input resistor coupled between the circuit input terminal and the node defined by the anode of the first diode and the cathode of the second diode.

6. A protective circuit in accordance with claim 5, wherein the resistance value of said polysilicon input resistor is at least 250 ohms.

* * * * *